(12) United States Patent
Wang et al.

(10) Patent No.: US 8,357,986 B2
(45) Date of Patent: Jan. 22, 2013

(54) HIGH SPEED ORTHOGONAL GATE EDMOS DEVICE AND FABRICATION

(75) Inventors: Hao Wang, Shanghai (CN); Wai Tung Ng, Thornhill (CA); Huaping Xu, North York (CA)

(73) Assignee: Asahi Kasei Microdevices, Tokyo (JP)

( * ) Notice: Subject to any disclaimer, the term of this patent is extended or adjusted under 35 U.S.C. 154(b) by 101 days.

(21) Appl. No.: 12/466,396

(22) Filed: May 15, 2009

(65) Prior Publication Data

US 2009/0283825 A1    Nov. 19, 2009

Related U.S. Application Data

(60) Provisional application No. 61/053,830, filed on May 16, 2008.

(51) Int. Cl.
*H01L 29/732* (2006.01)
(52) U.S. Cl. ......... 257/492; 257/330; 438/270; 438/286
(58) Field of Classification Search .................. 257/328, 257/330, 492; 438/270, 286
See application file for complete search history.

(56) References Cited

U.S. PATENT DOCUMENTS

| 7,851,857 | B2* | 12/2010 | Fu et al. ........................ 257/343 |
| 2007/0262398 | A1* | 11/2007 | Darwish et al. ............... 257/409 |
| 2009/0256212 | A1* | 10/2009 | Denison et al. ............... 257/408 |

OTHER PUBLICATIONS

Ludikhuize, Adriaan W., "A Review of RESURF Technology", International Symposium on Power Semiconductor Devices and ICs, 2000, pp. 11-18.
Imam Mohamed et al., "Design & Optimization of Double-RESURF High Voltage Lateral Devices for a Manufacturable Process", IEEE Transactions on Electron Devices, Jul. 2003, pp. 1697-1701, vol. 50, No. 7.

* cited by examiner

*Primary Examiner* — Fernando L Toledo
*Assistant Examiner* — Peter Bradford
(74) *Attorney, Agent, or Firm* — Maine Cernota & Rardin

(57) ABSTRACT

An orthogonal gate extended drain MOSFET (EDMOS) structure provides a low gate-to-drain capacitance ($C_{GD}$) and exhibits increased reliability. It has a gate electrode that is folded into the shallow trench isolation (STI) oxide region. Horizontal and vertical gate electrode segments provide gate control. It accommodates both high voltage devices and standard CMOS components on the same substrate. Reduced surface field (RESURF) technology is employed to optimize tradeoffs between high breakdown voltage and specific on-resistance. Device fabrication steps are compatible with standard CMOS flow and process modules can be added or removed from baseline CMOS technology.

7 Claims, 9 Drawing Sheets

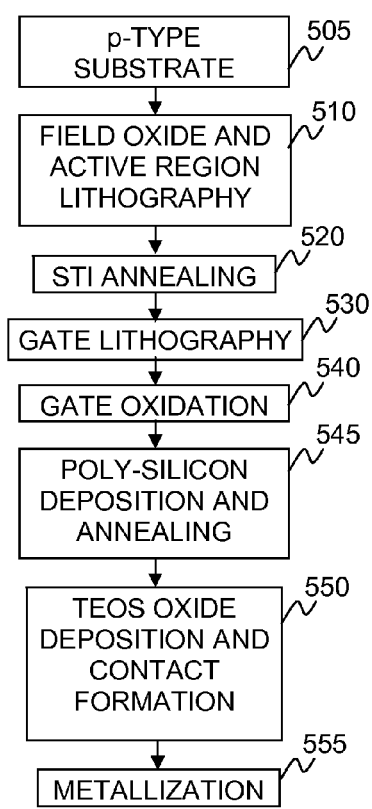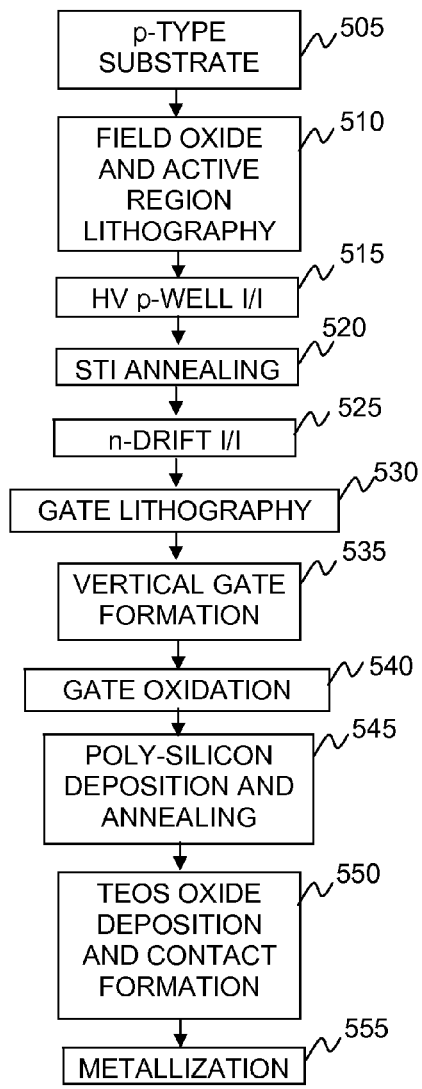
FIG. 5A
(PRIOR ART)
FIG. 5B

HIGH SPEED ORTHOGONAL GATE EDMOS DEVICE AND FABRICATION

RELATED APPLICATIONS

This application claims the benefit of U.S. Provisional Application No. 61/053,830, filed May 16, 2008; this application is herein incorporated in its entirety by reference.

FIELD OF THE INVENTION

The invention relates to power metal-oxide-semiconductor field-effect transistors (MOSFETs). Currently, Lateral Double Diffused MOS (LDMOS) or Extended Drain MOS (EDMOS) transistors are required to switch quickly between "on" and "off" states. In order to accomplish this, the gate to drain overlap capacitance must be minimized. In addition, this will also reduce the gate drive loss as the gate terminal is charged and discharged during every switching cycle.

BACKGROUND OF THE INVENTION

Power metal-oxide-semiconductor field-effect transistors (MOSFETs) are used in power electronic circuits as high frequency switches where they alternate between the on- and off-states. This enables the control of high load power with minimal dissipation in the device. While the power MOSFET is capable of switching at high speeds due to the absence of minority carrier transport, input capacitance limits its performance. In conventional LDMOS and EDMOS transistors, the input capacitance is relatively large due to the large gate area and the large overlap between gate and drain regions that serve as a field plate. Consequently, the upper cutoff frequency is usually limited by the charging and discharging of this input capacitance.

In addition to the gate-to-source capacitance ($C_{GS}$), a significant gate-to-drain capacitance ($C_{GD}$) must be included in the analysis due to the overlap of the gate electrode over the drift region.

The total input capacitance $C_{ISS}$ is:

$$C_{ISS}=C_{GS}+C_{GD}$$

If the input capacitance is relatively high, a relatively high gate current is needed to operate power MOSFETs. As a result, the gate switching loss will be significant, especially at switching frequencies beyond 1 MHz. This is not in reference to the gate circuit, it only considers the power loss within the device; a large $C_{GD}$ will result in a large switching loss. $C_{GS}$ is determined by the channel length, L and width, W required to achieve a certain on-resistance. It is optimized in embodiments of this application.

Furthermore, the frequency response limited by the RC charging time constant of the input gate circuit is given by:

$$f_{INPUT} = \frac{1}{2\pi C_{ISS} R_G}$$

Devices with a small $C_{GD}$ will have low switching loss and high cut off frequency.

What is needed, therefore, is a device exhibiting a low $C_{GD}$ employing fabrication techniques compatible with standard CMOS processing.

SUMMARY OF THE INVENTION

The orthogonal gate extended drain MOSFET (EDMOS) structure of the invention provides a low gate-to-drain capacitance ($C_{GD}$) and with fabrication steps that are compatible with the standard CMOS flow. It has an orthogonal gate structure, different from conventional EDMOS transistors. It has a gate electrode that is folded into the shallow trench isolation (STI) oxide region. Horizontal and vertical gate electrode segments provide gate control. The orthogonal gate electrode minimizes the gate to drain overlap, hence minimizing $C_{GD}$, while maintaining the same on-resistance and breakdown voltage as a similar size LDMOS/EDMOS transistor.

An embodiment is a metal-oxide-semiconductor field-effect transistor (MOSFET) semiconductor switching device comprising a substrate; an n-well layer on the substrate; a p-well layer on the n-well layer; an n-drift region proximate the p-well; a shallow trench isolation (STI) oxide proximate the n-drift region, between a source and a drain; and an orthogonal gate proximate the STI whereby gate-drain capacitance (CGD) is reduced thereby increasing peak diode recovery. In embodiments, the substrate comprises p-type substrate. Further embodiments comprise deep n-well isolation between adjacent devices and support applications requiring floating source potential. In embodiments, the n-drift region comprises reduced surface field (RESURF) technology to optimize high breakdown voltage and specific on-resistance. In other embodiments, the semiconductor switching device is a lateral double diffused metal-oxide-semiconductor field-effect transistor (LDMOS) semiconductor device. For yet other embodiments, the semiconductor switching device is an extended drain metal-oxide-semiconductor field-effect transistor (EDMOS) semiconductor device. For yet additional embodiments, horizontal and vertical gate electrode segments provide gate control.

Other embodiments provide a method for fabricating a semiconductor switching device comprising the steps of providing a substrate comprising n-well layer, p-well layer, and n-drift region; ion-implanting the p-well layer; annealing an STI region; ion-implanting the n-drift region; forming at least part of an orthogonal gate comprising lithography; forming a vertical portion of the orthogonal gate; forming contacts; and metallization wherein the n-drift region is in RESURF condition during operation. In an embodiment, the fabrication steps are compatible with standard CMOS fabrication flow. For other embodiments, the fabrication steps are compatible with 0.18 micron CMOS fabrication technology, and the fabrication steps accommodate high voltage devices and standard CMOS on a same substrate. In yet another embodiment, the thermal budget of the fabrication process allocated to standard CMOS devices is same as known designs, whereby electrical characteristics of standard CMOS devices are not altered. In some embodiments, process modules are optional steps that can be added or removed from baseline CMOS technology, and the gate is incorporated as part of the STI. For other embodiments, high voltage p-well implanted impurities can be activated together during the STI annealing, and dose of the n-drift region is about approximately $1\times10^{12}$ cm$^{-2}$. In yet other embodiments, the substrate is a <100> oriented p-type wafer with doping concentration of about approximately $1\times10^{15}$ cm$^{-3}$. For another embodiment, channel resistance contributed by horizontal component of the gate is about approximately 2 mΩ·mm2 per 0.1 micron. In yet another embodiment, the vertical gate formation comprises mask and etching steps.

Another embodiment is a metal-oxide-semiconductor field-effect transistor (MOSFET) semiconductor switching device comprising a p-type substrate; a deep n-well layer on the p-type substrate providing isolation between devices; a p-well layer on the n-well layer; an n-drift region proximate the p-well, wherein the n-drift region comprises reduced surface field (RESURF) technology to optimize high breakdown voltage and specific on-resistance; a shallow trench isolation (STI) oxide proximate the n-drift region, between a source and a drain; and an orthogonal gate proximate the STI whereby gate-drain capacitance (CGD) is reduced thereby increasing peak diode recovery.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 5A is a simplified flow chart depicting a prior art CMOS fabrication process.

FIG. 5B is a simplified flow chart depicting an orthogonal gate fabrication process in accordance with one embodiment of the present invention.

DETAILED DESCRIPTION

An orthogonal gate structure replaces the conventional gate/field plate structure in conventional LDMOS or EDMOS transistors. This gate structure reduces the gate-to-drain capacitance, $C_{GD}$ (Miller capacitance). The Figure-of-Merit, gate charge times on-resistance, (Qg×Ron) is improved at least 53%. The dv/dt capability is at least four times higher than that of the conventional EDMOS with similar device structure. The structure is also compatible with standard CMOS fabrication processes that include shallow trench isolation (STI).

Figure 1A:
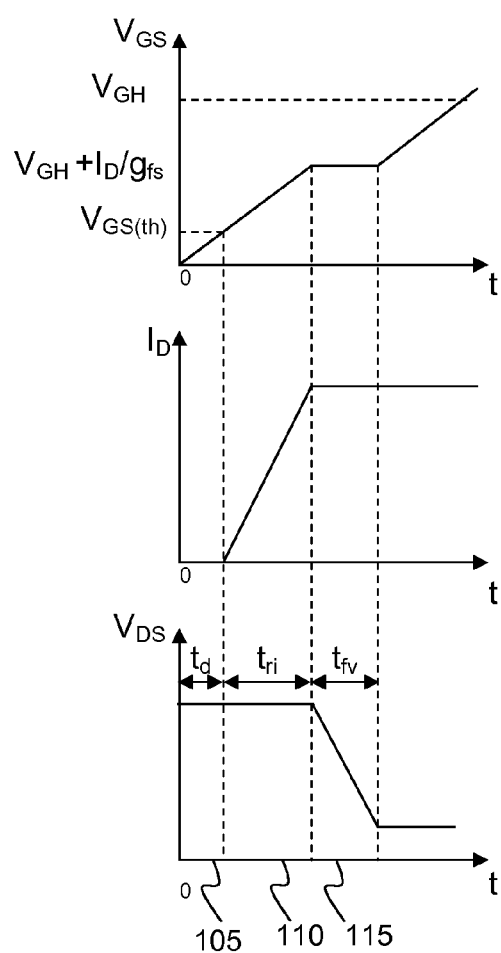
FIG. 1A shows simplified graphs of MOS turn-on waveforms.
Figure 1B:
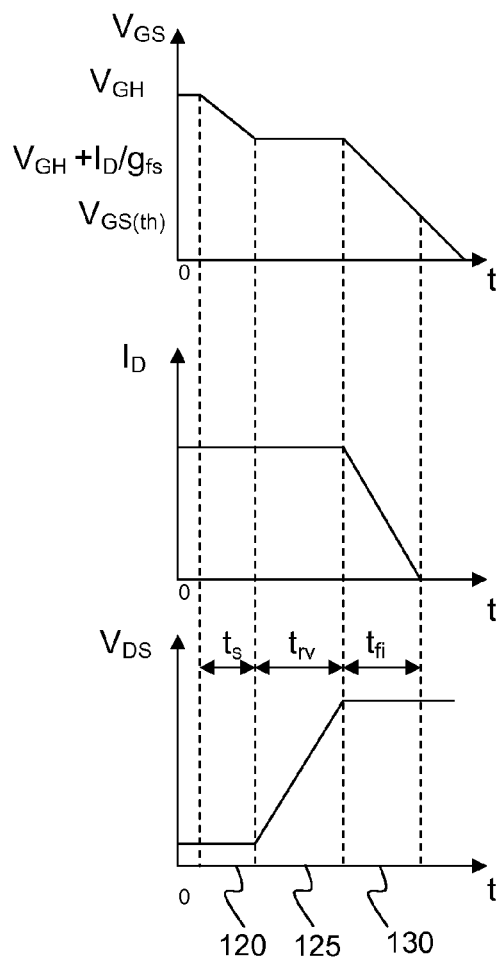
FIG. 1B shows simplified graphs of MOS turn-off waveforms.

FIGS. 1A and 1B show simplified graphs 100 of MOS turn-on and off waveforms, respectively. Turn-on delay, $t_{on}$, is the time taken to charge the input capacitance of the device before drain current conduction can start. Similarly, turn-off delay, $t_{off}$, is the time taken to discharge the capacitance after the device switched off. The turn-on delay time $t_{on}$ is equal to the sum of $t_d$ 105, $t_{ri}$ 110, and $t_{fv}$ 115 as below and depicted in FIG. 1A.

$$t_{on} = t_d + t_{ri} + t_{fv}$$

Where $$t_d = R_G(C_{GS} + C_{GD})\ln\frac{V_{GH}}{V_{GH} - V_{th}}$$

$$t_{ri} = R_G(C_{GS} + C_{GD})\ln\frac{g_m V_{GH}}{g_m(V_{GS} - V_{th}) - I_D}$$

$$t_{fv} = \frac{(V_{DM} - V_{on})R_G C_{GD}}{V_{GH} - (V_{th} + I_D/g_m)}$$

And where $V_{GH}$ is the high gate voltage (see FIG. 1A), $g_m$ is the transconductance, $V_{th}$, is the threshold voltage of the device, $V_{GS}$ is the gate voltage, $I_D$ is the drain current, $V_{DM}$ is the drain supply voltage, and $V_{on}$, is the on-state voltage drop. The turn-off delay time $t_{off}$ is equal to the sum of $t_s$ 120, $t_{rv}$ 125, and $t_{fi}$ 135 as below and depicted in FIG. 1B.

$$t_{off} = t_s + t_{rv} + t_{fi}$$

Where $$t_s = R_G(C_{GS} + C_{GD})\ln\frac{g_m V_{GH}}{g_m V_{th} + I_D}$$

$$t_{rv} = \frac{(V_{DM} - V_{on})g_m R_G C_{GD}}{I_D + g_m V_{th}}$$

$$t_{fi} = R_G(C_{GS} + C_{GD})\ln\frac{I_D + g_m V_{th}}{g_m V_{th}}$$

It is seen that a small value for $C_{GD}$ will result in fast turn-on and turn-off times.

Peak diode recovery is defined as the maximum rate of rise of drain-source voltage ($V_{DS}$) allowed, i.e., dv/dt capability. If this rate is exceeded, the voltage across the gate-source terminals may become higher than the threshold voltage of the device, forcing the device into current conduction mode, and under certain conditions a catastrophic failure may occur. One mechanism of dv/dt induced turn-on becomes active through the feedback action of the gate-drain capacitance, $C_{GD}$.

Figure 2:
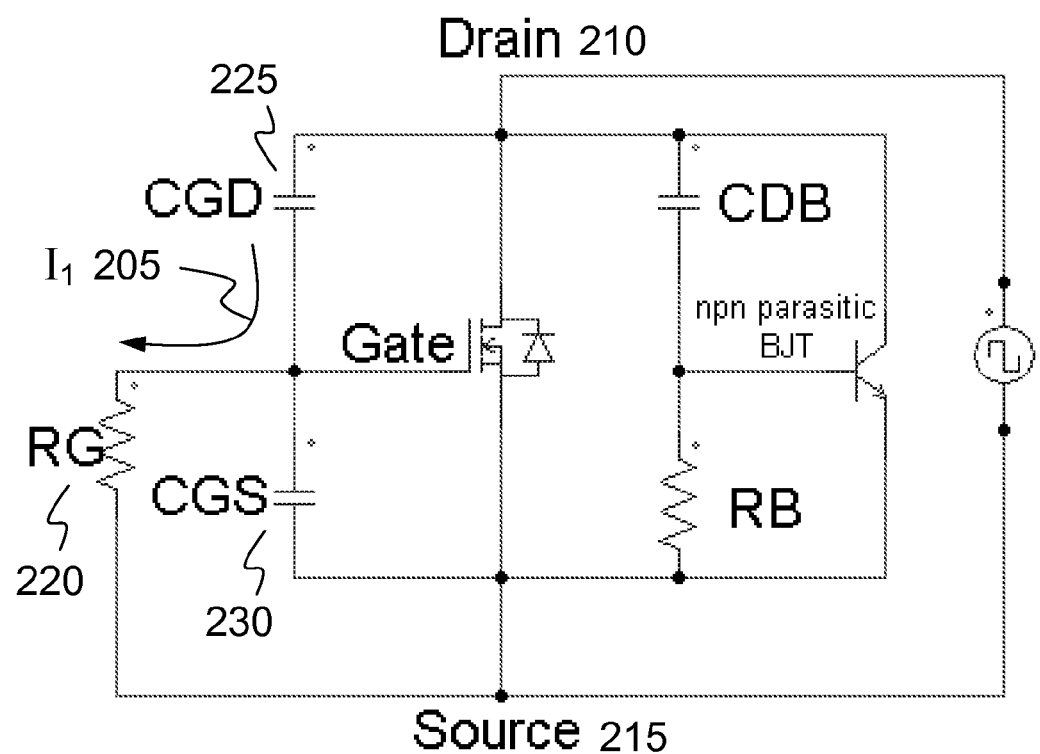
FIG. 2 is a simplified diagram illustrating an equivalent circuit of a power MOSFET.

FIG. 2 is a simplified diagram of an equivalent circuit 200 of a power MOSFET showing current path $I_1$ 205. When a voltage ramp appears across drain 210 and source 215 terminals of the device, a current $I_1$ 205 flows through gate resistance, $R_G$ 220, by means of gate-drain capacitance, $C_{GD}$ 225. The total resistance in the circuit is $R_G$ 220 and the voltage drop across it is given by:

$$V_{GS} = I_1 R_G = R_G C_{GD}\frac{dv}{dt}$$

When gate voltage $V_{GS}$ 230 exceeds the threshold voltage of the device $V_{th}$, the device is forced into conduction.

The dv/dt capability for this mechanism is thus set by:

$$\frac{dv}{dt} = \frac{V_{th}}{R_G C_{GD}}$$

It is evident that small $C_{GD}$ 225 values will result in large dv/dt capability, thus, the power MOSFET is more reliable.

Figure 3:
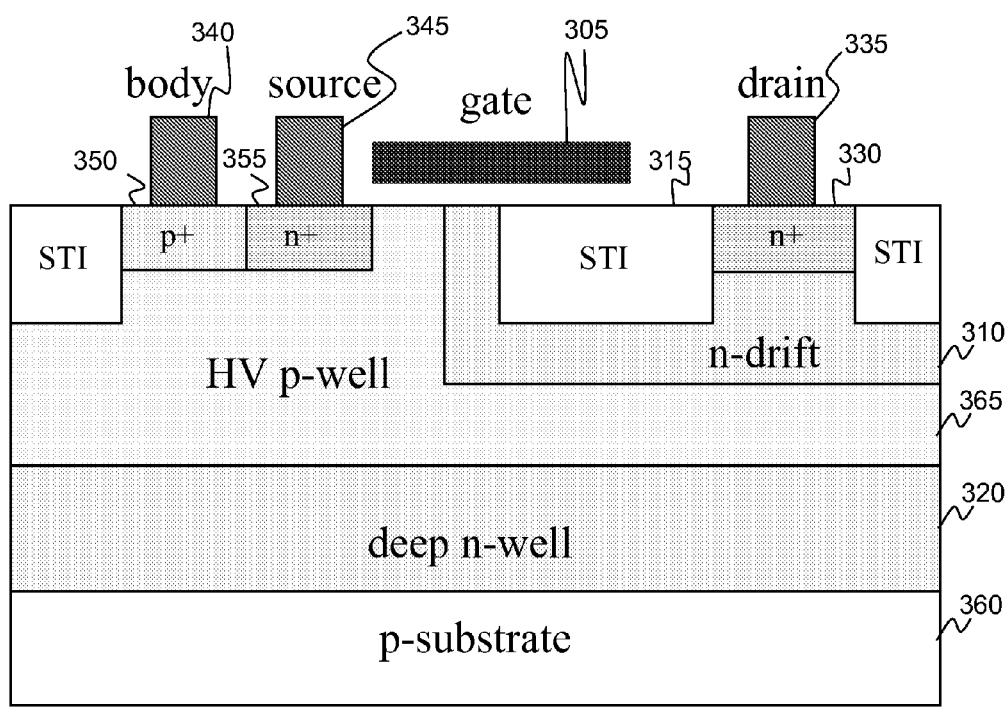
FIG. 3 is a sectional elevation view of a prior art EDMOS transistor.

FIG. 3 illustrates a sectional elevation view of a conventional prior art EDMOS transistor 300 portraying gate EDMOS transistor structure 305. A REduced SURFace field (RESURF) n-drift region 310 is underneath shallow trench isolation (STI) 315 and n+ region 330 beneath drain 335. The conventional gate transistor has a horizontal gate electrode 305. Body 340 and source 345 terminals are above p+ 350 and n+ 355 regions, respectively. Deep n-well 320 is between p-substrate 360 and high voltage (HV) p-well 365.

Figure 4:
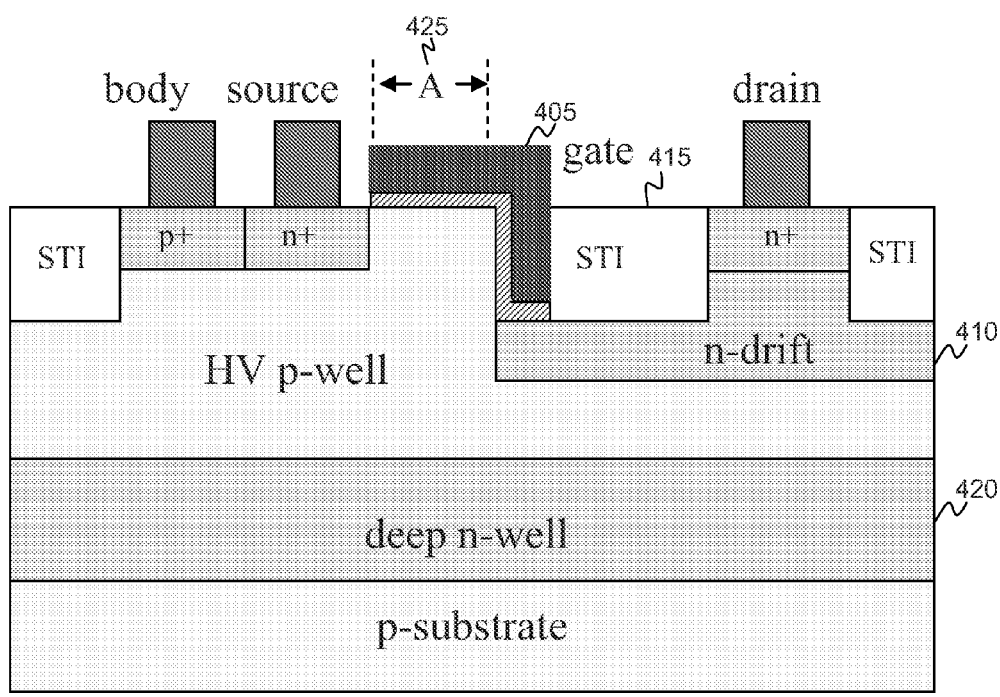
FIG. 4 is a sectional elevation view illustrating an orthogonal gate EDMOS transistor structure configured in accordance with one embodiment of the present invention.

FIG. 4 is a sectional elevation illustrating an orthogonal gate EDMOS transistor structure 400 configured in accordance with one embodiment of the present invention. Orthogonal gate electrode 405 reduces the gate-to-drain overlap capacitance ($C_{GD}$). Embodiments of this device are implemented in a 0.18 μm (micron) 30V HV-CMOS process. Compared to known EDMOS devices with the same voltage and size, a 75% $C_{GD}$ reduction can be observed. The Figure-of-Merit (FOM) is improved by at least 53%. In an embodiment, the depth of the STI is 0.35 μm, the width of vertical gate is 0.2 μm, and the gate oxide thickness is 12.5 nm.

The embodiment of the orthogonal gate EDMOS structure differs from conventional EDMOS transistors (FIG. 3) by this gate structure. The RESURF concept is used to achieve optimized tradeoff between high breakdown voltage and specific on-resistance ($R_{on,sp}$). RESURF is discussed in the publication by Adriaan W. Ludikhuize, "A Review of RESURF Technology", International Symposium on Power Semiconductor Devices and ICs (ISPSD), pp 11-18, 2000 and in Mohamed Imam et al.'s, "Design and Optimization of Double-RESURF High-Voltage Lateral Devices for a Manufacturable Process", IEEE Transactions on Electron Devices, VOL. 50, NO. 7, July 2003 the entirety of which are included herein by reference. Referring again to FIG. 4, n-drift region 410 is placed underneath shallow trench isolation (STI) 415. The orthogonal gate transistor has a gate electrode 405 that is folded into STI 415 oxide region. The horizontal and vertical gate electrode segments are used to provide gate control. RESURF n-drift region 410 allows the orthogonal gate EDMOS transistor to have the same breakdown voltage as the conventional EDMOS transistor. Since the overlap between the gate electrode 405 and the n-drift drain region 410 is only the thickness of the gate electrode, the overall gate-drain capacitance, $C_{GD}$ is significantly reduced.

The deep n-well 420 is formed by high energy ion implantation and is used for isolation between adjacent devices. Moreover, with the deep n-well 420, the n-channel EDMOS transistor can also be used as a high-side driver, as well as other applications that require floating source potential. The orthogonal gate EDMOS is designed to be compatible with a 0.18 μm CMOS fabrication technology. The gate structure can be easily incorporated as part of the STI fabrication step. The fabrication process is described next.

FIGS. 5A and 5B are simplified flow charts 500 of fabrication processes. FIG. 5A is a condensed flow chart depicting a prior art CMOS fabrication process, whereas FIG. 5B is a condensed flow chart depicting an orthogonal gate fabrication process in accordance with one embodiment of the present invention.

A p-type substrate is provided in step 505 of FIG. 5A. Field oxide and active region lithography are next carried out in step 510 followed by STI annealing in step 520. Gate lithography of step 530 is followed by gate oxidation of step 540. Poly-silicon deposition and annealing 542 are then implemented. Next are the tetraethylorthosilicate (TEOS) oxide deposition and contact formation of step 545, then metallization of step 550.

For an embodiment of FIG. 5B, the orthogonal gate EDMOS fabrication process is based on a 0.18 μm CMOS technology. This technology accommodates both high voltage devices (30V n and p-type EDMOS transistors) and standard CMOS on the same substrate. The thermal budget allocated to the standard CMOS devices is designed to remain the same as known designs; hence the electrical characteristics of the standard CMOS devices are not altered. The fabrication steps are compatible with the standard CMOS flow. Process modules are designed to be optional steps that can be added or removed from the baseline CMOS technology.

For embodiments, the starting wafer is a <100> oriented p-type wafer 505 with a doping concentration of $1 \times 10^{15}$ cm$^{-3}$. Similar to FIG. 5A, in step 510, field oxide and active region lithography are carried out. Additionally, for the embodiment of 5B, step 515 accomplishes HV p-well ion implantation (I/I). This is followed by STI annealing in step 520, common to both 5A and 5B. This embodiment then performs n-drift ion implantation in step 525. The step of gate lithography 530 is followed by vertical gate formation 535 for 5B's embodiment. The common step of gate oxidation 540 is followed by the common steps of poly-silicon deposition, etch, and doping annealing 545, tetraethylorthosilicate (TEOS) oxide deposition and contact formation 550 and then metallization of step 555.

At the beginning of the fabrication process, field oxidation is carried out to form a thick layer of oxide followed by active lithography both of step 510 and oxide etching to define the device area also in step 510. After the formation of the HV p-well ion implantation 515, STI deposition and annealing 520, and deep n-drift ion implantation 525 are performed. The HV p-well implanted impurities can be activated together during the STI annealing 520. The n-drift ion implantation 525 is carried out after the STI annealing 520, because RESURF conditions require careful control of the n-drift dose and junction depth. Gate lithography 530 and etch 535, gate oxidation 540, poly-silicon deposition, poly-silicon etch and doping annealing 545 are then carried out to form the gate electrode.

Note that the steps may be performed in alternate orders provided that the n-drift ion implantation step is carried out after STI annealing.

Figure 6:
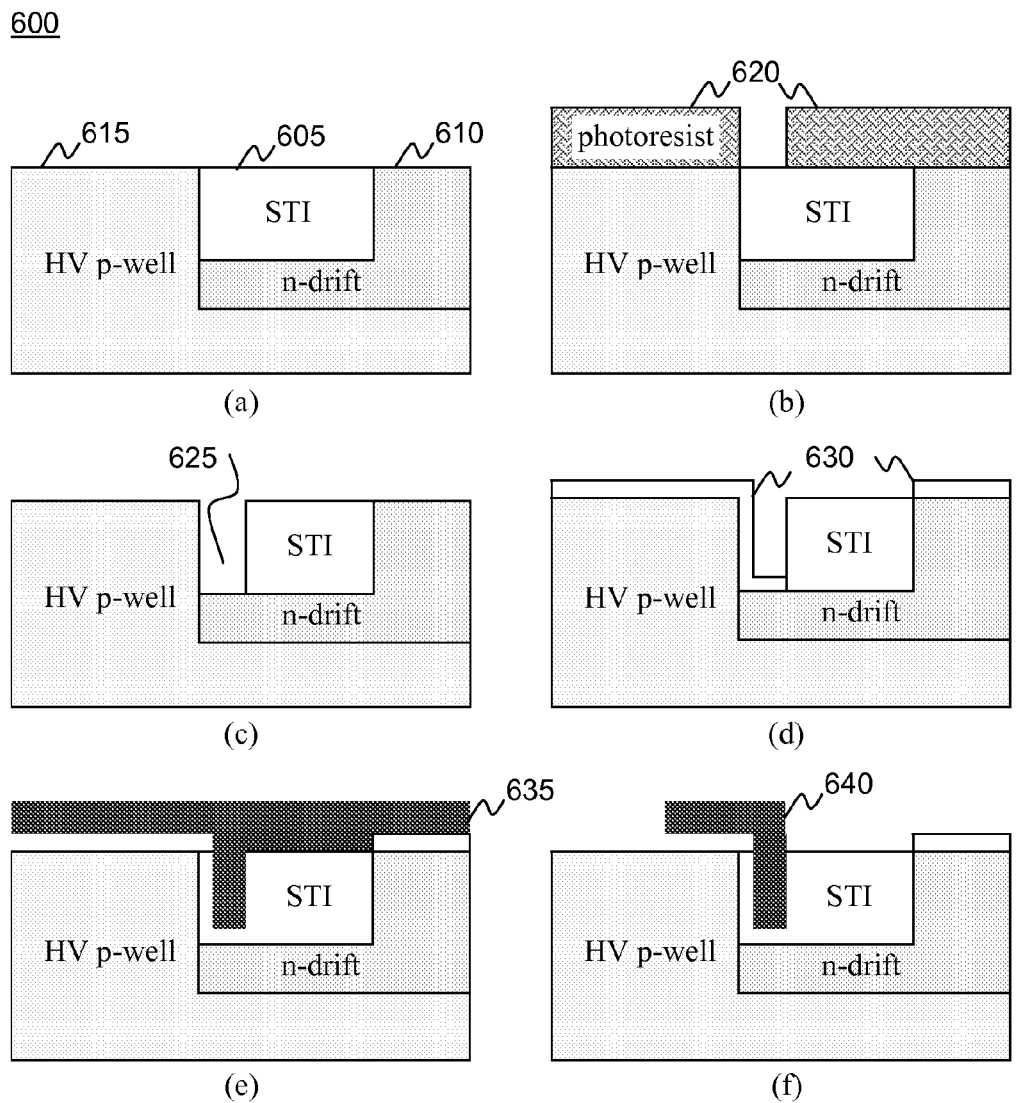
FIG. 6 is a sectional elevation view illustrating a plurality of simplified processing steps for fabricating an orthogonal gate EDMOS transistor structure configured in accordance with one embodiment of the present invention.

FIG. 6 is a sectional elevation view illustrating a plurality of processing steps 600 for fabricating an orthogonal gate EDMOS transistor structure configured in accordance with one embodiment of the present invention. The orthogonal gate fabrication process flow is as follows in steps (a) through (f). Step (a) depicts the structure right after STI 605 formation (after Step 525 of FIG. 5B). It also shows n-drift region 610 and HV p-well 615. Step (b) depicts orthogonal gate lithography with photoresist 620 (also Step 535 of FIG. 5B). Step (c)'s dry etching produces trench 625 (also Step 535 of FIG. 5B). In step (d), gate oxidation 630 is grown in trench 625 along HV p-well 615 surface and STI 605 trench floor, and over upper surfaces of n-drift region 610 and HV p-well 615 (also Step 540 of FIG. 5B). Step (e) depicts gate polysilicon 635 deposition into trench 625 and on gate oxidation 630, plus STI 605 (Step 545 of FIG. 5B). In step (f), gate lithography is employed. The conventional gate mask is then used to definite the entire orthogonal gate electrode. Thereafter, a thick inter-level oxide deposition of TEOS is followed by contact lithography and oxide etching to form the contact window (Step 550 of FIG. 5B). Finally, metallization covers the chip surface and forms the contacts for the EDMOS (Step 555 of FIG. 5B). From these steps, it is seen that the vertical gate formation requires an extra mask (see FIG. 6(b)) and an extra etching step (see FIG. 6(c)).

Note that the steps may be performed in alternate orders provided that the n-drift ion implantation step is carried out after STI annealing.

Figure 7:
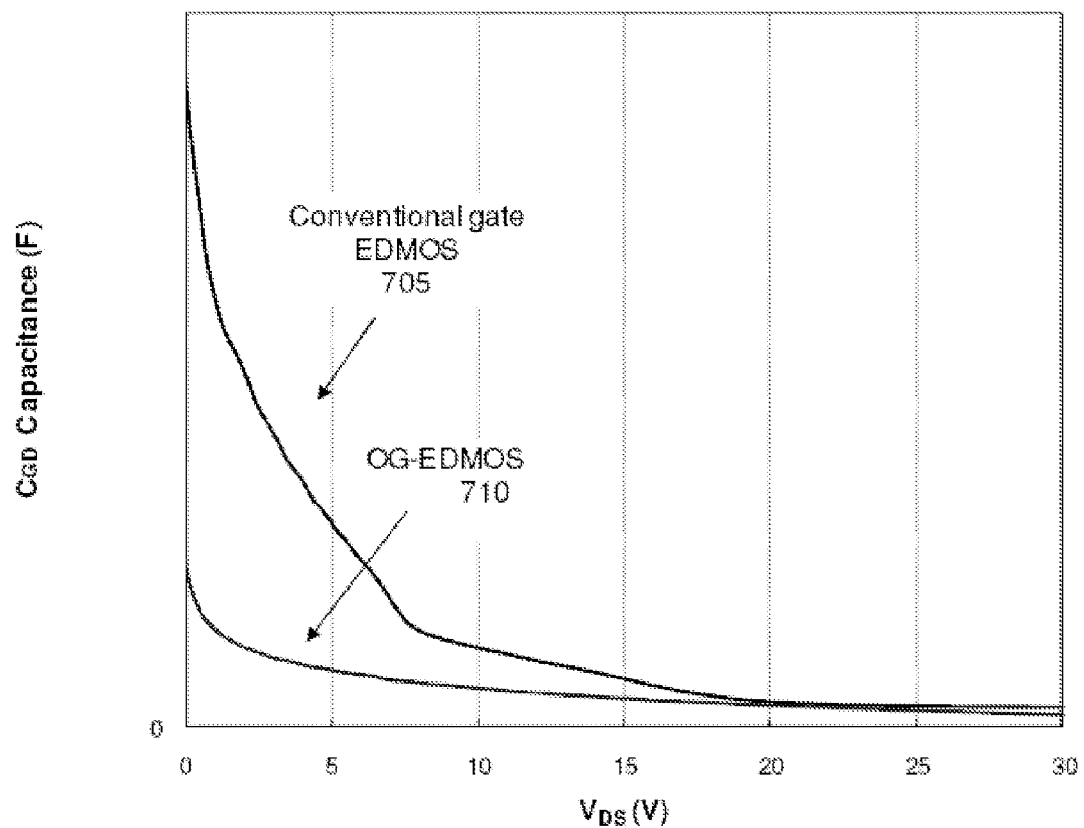
FIG. 7 is a graph illustrating a $C_{GD}$ reduction comparison configured in accordance with one embodiment of the present invention.

FIG. 7 is a graph 700 illustrating a reduction of Gate Drain Capacitance ($C_{GD}$) as function of $V_{DS}$ comparison for an embodiment of the present invention. Curve 705 represents $C_{GD}$ for a conventional gate EDMOS device. Curve 710 represents $C_{GD}$ for an orthogonal gate (OG) EDMOS device showing the decreased $C_{GD}$.

Figure 8:
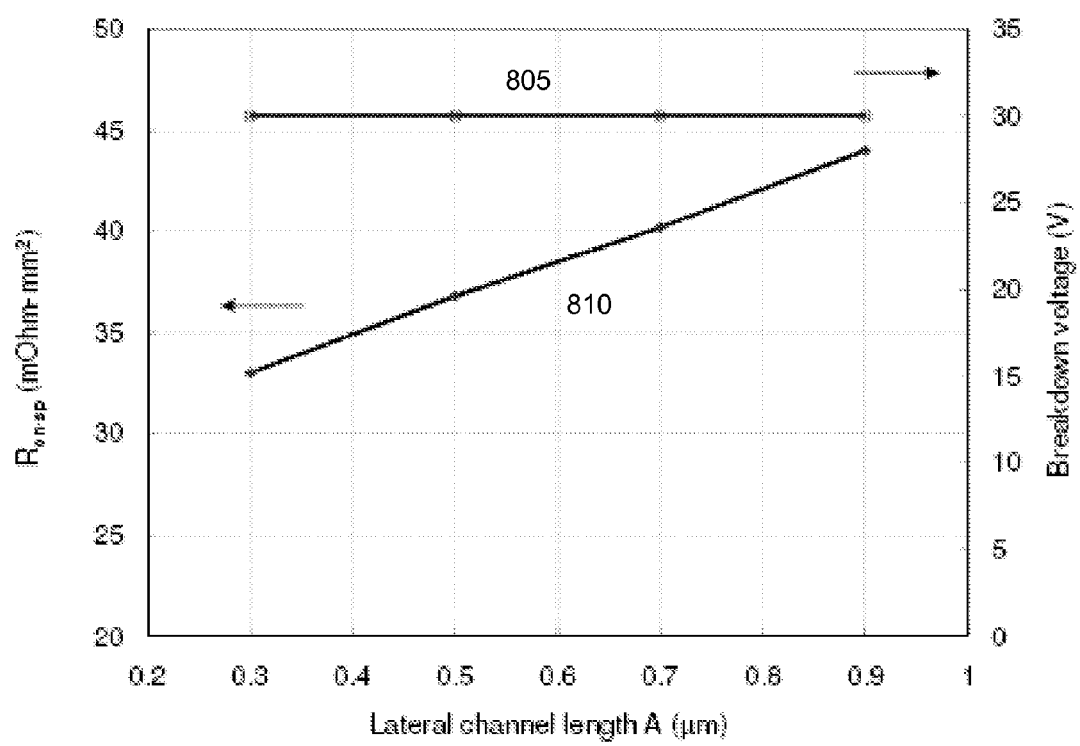
FIG. 8 is a graph illustrating breakdown voltage (BV) and specific on-resistance vs. Distance A configured in accordance with one embodiment of the present invention.

FIG. 8 is a graph 800 illustrating breakdown voltage (BV) and specific on-resistance versus lateral channel Distance A configured in accordance with one embodiment of the present invention. The specific on-resistance $R_{on,sp}$ for the orthogonal EDMOS transistor is simulated for various lateral channel lengths, A (425 in FIG. 4), while keeping all other parameters constant. The channel resistance contributed by A is 2 m$\Omega\cdot$mm$^2$ per 0.1 μm.

Figure 9:
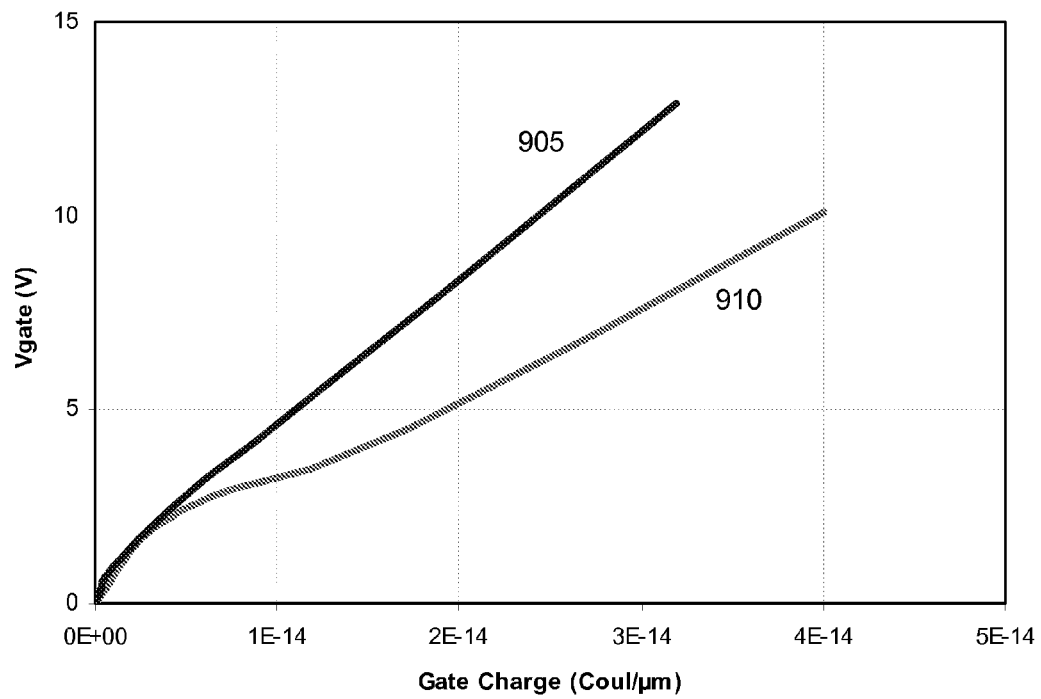
FIG. 9 is a graph illustrating gate charge comparison configured in accordance with one embodiment of the present invention.

FIG. 9 is a graph 900 illustrating simulation data for a gate charge comparison between OG-EDMOS 905 and conventional EDMOS 910, configured in accordance with one embodiment of the present invention. The reduction in $C_{GD}$ leads to faster switching speeds and higher tolerance to dv/dt of the drain voltage. The reduction in gate charge ($Q_g$) results in lower gate switching loss.

BV analysis provides that as long as the n-drift region is in RESURF condition, the breakdown voltage follows the simple relationship:

$$BV = E_{lat} \cdot L_{drift}$$

Where $E_{lat}$=10-15V/μm and $L_{drift}$ is the length of the drift region.

$R_{on}$ analysis provides that $R_{on,sp} = R_{sh} \cdot L_{drift}^2$,

Where sheet resistance $R_{sh}$=4-5 k$\Omega$/sq.

RESURF condition provides that for single RESURF condition, the dose of the n-drift region is approximately 1×10$^{12}$ cm$^{-2}$.

The orthogonal gate may be employed for universal breakdown voltage. For higher than 30V breakdown voltage EDMOS, the drift region length should be increased, but near the orthogonal gate region, the critical electrical field is still kept the same as 10-15V/μm. Therefore, the OG-EDMOS can work for any breakdown voltage EDMOS while keeping the $R_{on,sp}$ low.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A metal-oxide-semiconductor field-effect transistor (MOSFET) semiconductor switching device comprising:
    a substrate;
    an n-well layer on the substrate;
    a p-well layer on the n-well layer;
    an n-drift region proximate the p-well;
    a shallow trench isolation (STI) oxide proximate the n-drift region, between a source and a drain;
    wherein the n-drift region is on the p-well layer and below the STI;
    an orthogonal gate proximate the STI,
    an orthogonal gate electrode having a cross-section as viewed through layers of the transistor, direction of the view taken perpendicular to direction connecting the source and the drain, the orthogonal gate electrode cross-section having a vertical first segment contiguous with a horizontal second segment, the horizontal second segment being perpendicular to the vertical first segment and extending past the vertical first segment in a first direction and not extending past the vertical first segment in a second direction opposite the first direction, wherein the horizontal second gate electrode segment is disposed above the p-well layer in the first direction and the vertical first gate electrode segment is incorporated into an end of the STI; and
    a gate oxidation film vertically disposed only between the p-well layer and adjacent side of the vertical first segment of the orthogonal gate electrode and disposed horizontally between bottom of the vertical first segment of the orthogonal gate electrode and the n-drift region; and disposed horizontally between the horizontal second segment of the orthogonal gate electrode and the p-well layer;
    wherein the n-drift region extends horizontally in the first direction to and not beyond a vertical face of the p-well layer adjacent to the proximate gate oxidation film vertical face of the vertical first segment of the orthogonal gate electrode,
    whereby gate-drain capacitance ($C_{GD}$) is reduced thereby increasing peak diode recovery.

2. The semiconductor device of claim 1, comprising deep n-well isolation between adjacent devices and supporting applications requiring floating source potential.

3. The semiconductor device of claim 1, wherein said n-drift region comprises reduced surface field (RESURF) technology to optimize high breakdown voltage and specific on-resistance.

4. The semiconductor device of claim 1, wherein said semiconductor switching device is a lateral double diffused metal-oxide-semiconductor field-effect transistor (LDMOS) semiconductor device.

5. The semiconductor device of claim 1, wherein said semiconductor switching device is an extended drain metal-oxide-semiconductor field-effect transistor (EDMOS) semiconductor device.

6. The semiconductor device of claim 1, wherein said horizontal second and said vertical first gate electrode segments provide gate control.

7. A metal-oxide-semiconductor field-effect transistor (MOSFET) semiconductor switching device comprising:
    a substrate;
    an n-well layer on the substrate;
    a p-well layer on the n-well layer;
    an n-drift region proximate the p-well;
    a shallow trench isolation (STI) oxide proximate the n-drift region, between a source and a drain; wherein the n-drift region is on the p-well layer and below the STI;
    an orthogonal gate proximate the STI;
    an orthogonal gate electrode having a cross-section as viewed through layers of the transistor, direction of the view taken perpendicular to direction connecting the source and the drain, the orthogonal gate electrode cross-section having a vertical first segment contiguous with a horizontal second segment, the horizontal second segment being perpendicular to the vertical first segment and extending past the vertical first segment in a first direction and not extending past the vertical first segment in a second direction opposite the first direction, wherein the horizontal second gate electrode segment is disposed above the p-well layer in the first direction and the vertical first gate electrode segment is incorporated into an end of the STI;

a gate oxidation film vertically disposed only between the p-well layer and adjacent side of the vertical first segment of the orthogonal gate electrode and disposed horizontally between bottom of the vertical first segment of the orthogonal gate electrode and the n-drift region; and disposed horizontally between the horizontal second segment of the orthogonal gate electrode and the p-well layer;

wherein the n-drift region extends horizontally in the first direction to and not beyond a vertical face of the p-well layer abutting the proximate gate oxidation film vertical face of the vertical first segment of the orthogonal gate electrode, whereby gate-drain capacitance ($C_{GD}$) is reduced thereby increasing peak diode recovery;

wherein the device is implemented in 0.18 micron 30V HV-CMOS;

wherein the horizontal segment (A) of the gate is between about 0.3 and about 0.9 microns;

wherein channel resistance contributed by the horizontal segment of the gate is about 2 m$\Omega$mm$^2$ per 0.1 micron;

wherein depth of the STI is about 0.35 microns;

wherein width of the vertical gate is about 0.2 microns;

wherein thickness of the gate oxide is about 12.5 nm;

wherein dose of the n-drift region is about $1\times10^{12}$ cm$^{-2}$;

wherein the substrate is a <100> oriented p-type wafer having a doping concentration of about $1\times10^{15}$ cm$^{-3}$; and whereby dv/dt capability is increased.

\* \* \* \* \*

UNITED STATES PATENT AND TRADEMARK OFFICE
CERTIFICATE OF CORRECTION

PATENT NO. : 8,357,986 B2
APPLICATION NO. : 12/466396
DATED : January 22, 2013
INVENTOR(S) : Hao Wang, Wai Tung Ng and Huaping Xu Page 1 of 1

It is certified that error appears in the above-identified patent and that said Letters Patent is hereby corrected as shown below:

Title page
Item (73), Assignee, change "Asahi Kasei Microdevices" to -- Asahi Kasei Microdevices Corporation --

Signed and Sealed this
Twelfth Day of August, 2014

Michelle K. Lee
*Deputy Director of the United States Patent and Trademark Office*